United States Patent [19]

Yanagi

[11] Patent Number: 5,173,448
[45] Date of Patent: Dec. 22, 1992

[54] PROCESS FOR FABRICATING A SEMICONDUCTOR DEVICE

[75] Inventor: Masahiko Yanagi, Nara, Japan

[73] Assignee: Sharp Kabushiki Kaisha, Osaka, Japan

[21] Appl. No.: 791,527

[22] Filed: Nov. 14, 1991

[30] Foreign Application Priority Data

Nov. 21, 1990 [JP] Japan ................... 2-318684

[51] Int. Cl.[5] .................... H01L 21/44; H01L 21/465
[52] U.S. Cl. .................... 437/186; 437/187; 437/195; 437/228; 437/238
[58] Field of Search ........... 437/186, 187, 195, 228

[56] References Cited

U.S. PATENT DOCUMENTS 4,859,618  8/1989  Shikata et al. ............... 437/187 X
4,910,169  3/1990  Hoshino ....................... 437/195 X

FOREIGN PATENT DOCUMENTS 288442  12/1986  Japan ........................ 437/187
223748   9/1989  Japan ........................ 437/195

Primary Examiner—John S. Maples
Attorney, Agent, or Firm—Nixon & Vanderhye

[57] ABSTRACT

The present invention provides a process for fabricating a semiconductor device including the steps of: depositing a CVD film by a bias ECRCVD process on a wiring layer having an intended contact region in which a wiring line are made wider than in other regions; coating planarly the CVD film with a resist film; etching the resist film back so as to expose a protuberance of the CVD film formed above the inteded contact region; and etching the protuberance and the CVD film thereunder to open a contact hole down to the intended contact region of the wiring layer.

2 Claims, 3 Drawing Sheets

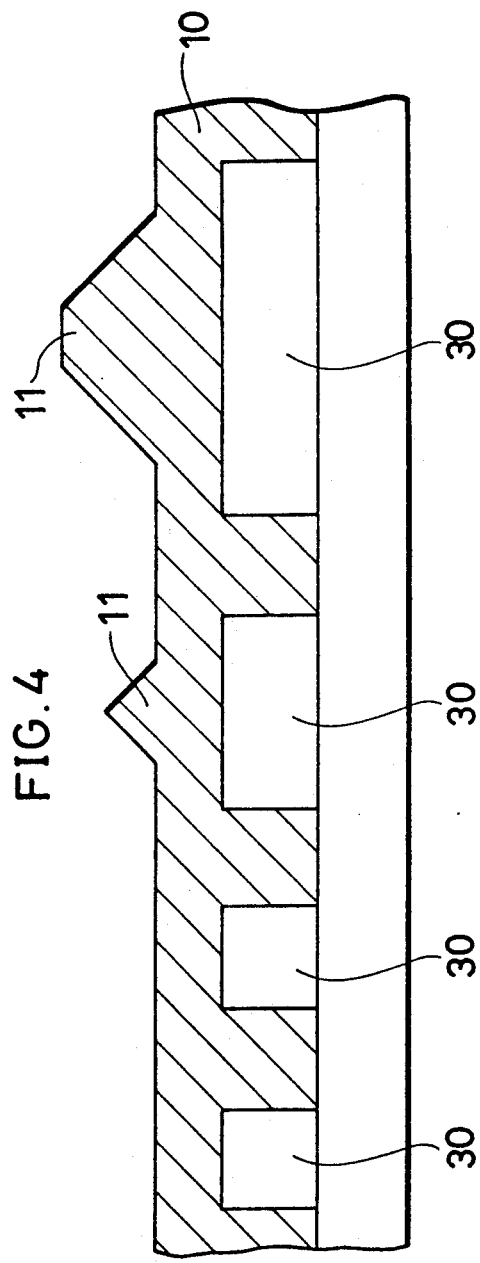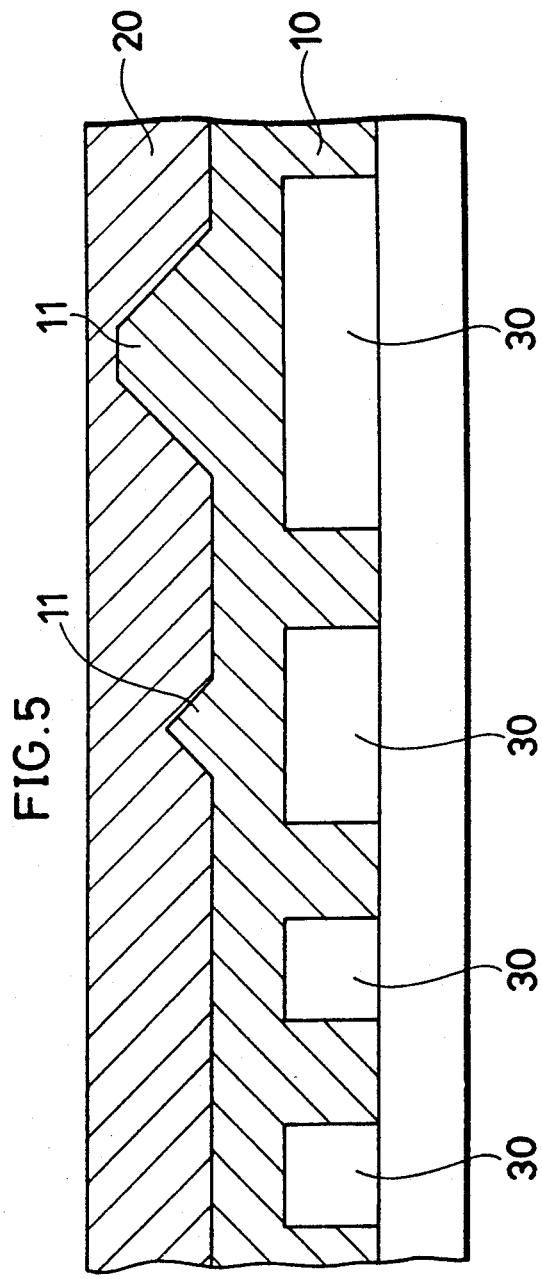

PROCESS FOR FABRICATING A SEMICONDUCTOR DEVICE

FIELD OF THE INVENTION

This invention relates to a process for fabricating a semiconductor device and, more particularly to a process for forming a contact hole in a self-aligned fashion by utilizing a protuberance of a CVD film formed by bias ECRCVD process, the protuberance being a drawback inherent to the bias ECRCVD process.

BRIEF DESCRIPTION OF THE DRAWINGS

FIG. 4 is a sectional view schematically illustrating a protuberance which is a drawback of bias ECRCVD process.

FIG. 5 is a sectional view schematically illustrating a method of removing the protuberance.

DESCRIPTION OF THE RELATED ARTS

Figure 1:
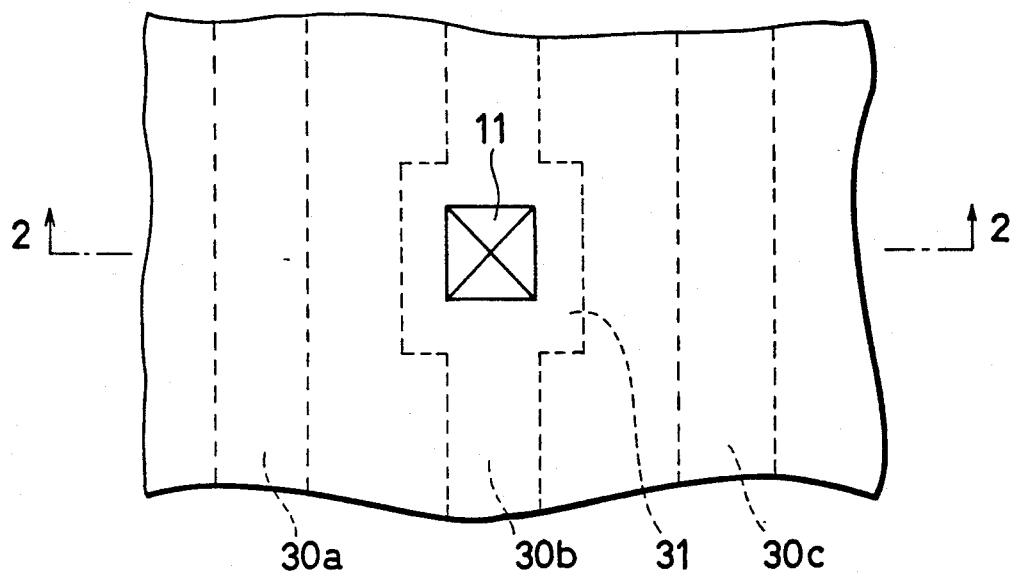
FIG. 1 is a plan view schematically illustrating a CVD film which is not yet coated with a resist film.

Referring to FIGS. 4 and 5, when a CVD film 10 is deposited on a wiring layer by bias ECRCVD process, a protuberance 11 of a substantially triangular or trapezoidal shape in section is formed above a relatively wide wire 30. This protuberance 11 becomes an obstacle in obtaining a planar CVD film or layer insulator. For planarizing the CVD film 10, it is a conventional practice to coat the CVD film 10 with a resist film 20 having the same etch selectivity and etch rate with the CVD film 10 to planarly cover the protuberance 11 and etch away the resist film 20 together with the protuberance 11.

As stated above, the protuberance produced by the bias ECRCVD process is useless, and study for overcoming such a drawback has been continuously made.

SUMMARY OF THE INVENTION

It is an object of the invention to provide a process of forming a contact hole, which is more microscopic than that by a conventional process, by effectively utilizing a protuberance.

Thus, the present invention provides a process for fabricating a semiconductor device comprising the steps of: depositing a CVD film by a bias ECRCVD process on a wiring layer having an intended contact region in which a wiring line are made wider than in other regions; coating planarly the CVD film with a resist film; etching the resist film back so as to expose a protuberance of the CVD film formed above the intended contact region; and etching the protuberance and the CVD film thereunder to open a contact hole down to the intended contact region of the wiring layer.

According to the present invention, the CVD film is planarly coated with the resist film so as to cover the protuberance formed due to the bias ECRCVD process. Subsequently, the resist film is etched back to expose the protuberance from the resist film. In this case the resist film is etched preferably at a rate higher than or same as the CVD film is etched. In turn, anisotropic etching, showing a higher etch rate in the vertical direction than in the horizontal direction, is carried out to open a contact hole downwardly in the CVD film. In this case the CVD film is etched preferably at a rate far higher than the resist film is etched.

DETAILED DESCRIPTION OF THE PREFERRED EMBODIMENTS

Hereinafter, an embodiment of the invention will be detailed with reference to the drawings.

A process for fabricating a semiconductor device in the present embodiment includes the steps of: depositing a CVD film 10 by means of a bias ECRCVD process on a wiring layer having an intended contact region 31 in which a wiring line is widened rather than in other regions; coating planarly a resist film 20 over the CVD film 10; etching the resist film 20 back so as to expose a protuberance 11 of the CVD film 10 formed above the intended contract region 31; and etching the protuberance 11 and the CVD film 10 existing thereunder to open a contact hole.

A silicon substrate 50 is formed with a wiring layer having three wiring lines 30a, 30b and 30c made of aluminum or polysilicon. This embodiment is intended to open a contact hole 40 down to the central wiring line 30. The intended contact region 31 of the wiring line 30b is made wider than other regions thereof. The overall wiring lines 30a and 30c and the wiring line 30b except the intended contact region 31 are made to have a width such as not to form a protuberance when the CVD film 10 is deposited thereon by the bias ECRCVD process.

As shown in FIG. 1, when the bias ECRCVD process is performed to deposit the CVD film on the above wiring layer, the protuberance 11 shaped like pyramid is formed upwardly from the CVD film 10 deposited on the intended contact region 31.

Figure 2A:
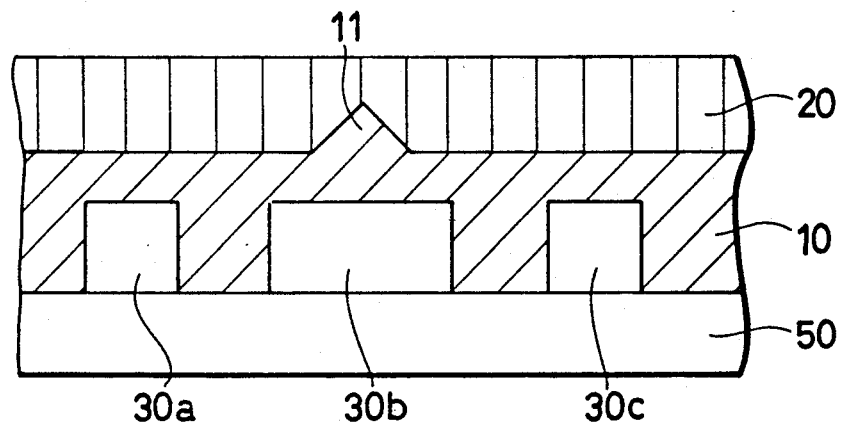
FIGS. 2(a) through 2(c) are each a sectional view taken along A—A line of FIG. 1 for schematically illustrating each step of semiconductor device fabrication in one embodiment according to the invention.

As shown in FIG. 2(a), the CVD film 10 with the protuberance 11 is in turn completely and planarly coated with the resist film 20. In this case it is desired that this coating process be performed in accordance with a spin coating method to have a planar resist surface.

Figure 2B:
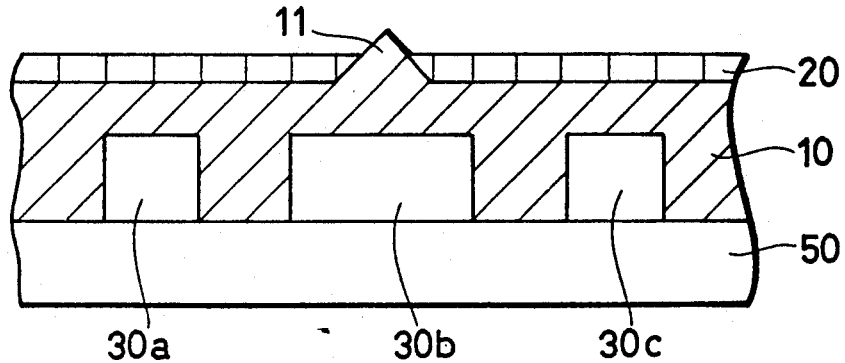

As shown in FIG. 2(b), the resist film 20 is then etched back with an etching method such as to etch the resist film 20 at a rate higher than or same as to etch the CVD film 10, thereby exposing simply the protuberance 11 from the resist film 20. This is because a portion of the resist film 20 on the protuberance 11 is thinner than other portions thereof.

Figure 2C:
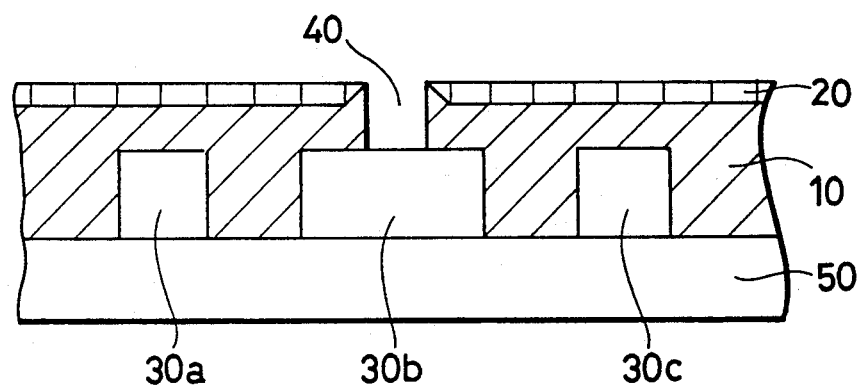

As shown in FIG. 2(c), the above etching method is then changed over to an anisotropic etching such as to etch the CVD film 10 at a rate far higher than to etch the resist film 20 and such as to etch much more in vertical direction than in horizontal direction. This anisotropic etching permits to open the contact hole 40 in the CVD film down to the intended contact region 31 of the wiring line 30b.

Figure 3:
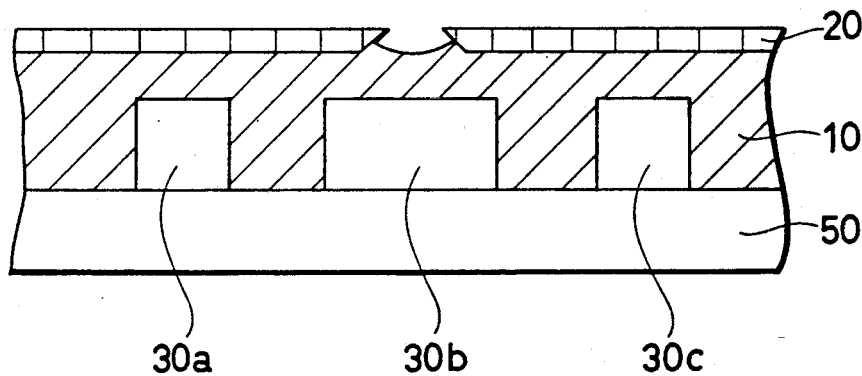
FIG. 3 is also a sectional view schematically illustrating a step of semiconductor fabrication in another embodiment according to the invention.

It should be understood that if the protuberance 11 and the CVD film existing thereunder are etched with an isotropic etching instead of the anisotropic etching, the CVD film 10 can be made planar, as shown in FIG. 3.

In such a process for fabricating a semiconductor device, the thickness of the CVD film 10 assumes a total value of the thickness of the wiring line (wiring lines 30a, 30b or 30c) plus 2000-4000 Å. Accordingly, if the wiring line is 2500 Å thick, the thickness of the CVD film 10 assumes 4500-6500 Å.

The height of the protuberance 11 usually assumes a value of about a half of the wiring line width minus 1000-2000 Å. The wiring line width at the intended contact region is about 0.8 μm and at other regions about 0.5 μm or less. The space between the wiring lines is not particularly limited within the processability range. Accordingly, the height of the protuberance 11 is 1000-2000 Å thick when the wiring line width is 0.5-0.8 μm.

As has been described, the process for fabricating a semiconductor device in accordance with the present invention comprises the steps of: depositing a CVD film by a bias ECRCVD process on a wiring layer having an intended contact region in which a wiring line are made wider than in other regions; coating planarly the CVD film with a resist film; etching the resist film back so as to expose a protuberance of the CVD film formed above the intended contact region; and etching the protuberance and the CVD film thereunder to open a contact hole down to the intended contact region of the wiring layer.

Thus, a contact hole can be formed by effectively utilizing a protuberance which is inherent to the bias ECRCVD process and which has been useless in the conventional arts. Further, this protuberance is so fine that a microscopic contact hole, smaller than that by the conventional method, can be opened. In addition, since such a contact hole is formed in self-alignment fashion, there is no need to conduct an alignment step for forming the contact hole.

Whole the present invention has been described with reference to a preferred embodiment thereof, it will be understood by those skilled in the art that various changes may be made in embodiments of the invention without departing from the spirit or scope of the invention.

What is claimed is:

1. A process for fabricating a semiconductor device comprising the steps of:

depositing a CVD film by a bias ECRCVD process on a wiring layer having an intended contact region in which a wiring line is made wider than in other regions;

coating planarly the CVD film with a resist film;

etching the resist film back so as to expose a protuberance of the CVD film formed above the intended contact region; and etching the protuberance and the CVD film thereunder to open a contact hole down to the intended contact region of the wiring layer.

2. A process as set forth in claim 1, wherein the thickness of the CVD film is 4500-6500 Å; and the height of the protuberance is 1000-2000 Å.

* * * * *